INTEGRATED INSULATED GATE FIELD EFFECT LOGIC CIRCUITRY

Filed Sept. 8, 1965 4 Sheets-Sheet 1

INVENTORS
JACK R. DAILEY
NICHOLAS M. GUYDOSH

BY John C Black
ATTORNEY

INTEGRATED INSULATED GATE FIELD EFFECT LOGIC CIRCUITRY

United States Patent Office
3,414,740
Patented Dec. 3, 1968

3,414,740
INTEGRATED INSULATED GATE FIELD EFFECT LOGIC CIRCUITRY

Jack R. Dailey, Apalachin, and Nicholas M. Guydosh, Endicott, N.Y., assignors to International Business Machines Corporation, Armonk, N.Y., a corporation of New York Filed Sept. 8, 1965, Ser. No. 485,761
16 Claims. (Cl. 307—304)

ABSTRACT OF THE DISCLOSURE

A multifunction logic element is fabricated in the form of a field effect device of the insulated gate type. The device includes a substrate of one conductivity type and at least three regions of opposite conductivity type separated by elongated channels. Metallic gates overlay the channels to selectively connect the regions to each other in response to input signals. Loads are formed by diffusing elongated strips of the opposite conductivity type into the substrate and are connected to all except one of said regions. Operating potentials can be connected to the regions so as to operate the device in the inverting or noninverting mode. By selective connection of certain of the gates to each other and/or to selected voltage sources, the device can be operated to perform various logical functions.

This invention relates to versatile logical elements utilizing the insulated gate, field effect principle.

Field effect devices of the insulated gate type are characterized by a semiconductor substrate of one conductivity type and a pair of closely spaced semiconductor areas of the opposite conductivity type which may, for example, be diffused in the substrate. An insulating material such as silicon dioxide is deposited over the semiconductor materials and a metallic gate is deposited on the insulating material over the channel of substrate material which lies between the two diffused semiconductor areas. One of the diffused areas is referred to as the source and may have ground potential applied thereto, and the other diffused area, referred to as the drain, is coupled through a resistance to a source of bias potential of a polarity opposite that of its conductivity type. When a potential of the same polarity as the bias potential is applied to the metallic gate, it induces in the channel a surface region of opposite conductivity type, thereby electrically connecting the source to the drain to provide a low impedance path.

For more than a decade, logical circuit designers have been attempting to devise low cost, versatile "universal" logical elements of semiconductor materials. In most instances, the attempts were characterized by circuits comprised of discrete semiconductor and passive components. Improvements in fabricating technology now permit many of these circuits to be produced in integrated form; however, in each of the known attempts to devise universal logical elements, an unduly large number of semiconductor elements are utilized in the logical element, many of which are not functionally operable for many of the logical forms which the element can take. These universal logical elements are so inefficient in the utilization of the individual components therein, as to find little or no use in commercial equipment.

Accordingly, it is a primary object of the present invention to provide a versatile logical element which is particularly well adapted to monolithic fabrication and which is very efficient in the use of the semiconductor elements forming a part thereof.

It is another object of the present invention to provide an improved logical element utilizing the insulated gate, field effect principle.

These objects are achieved in one embodiment of the present invention by the use of a field effect device of the insulated gate type which is characterized by one source and two or more drains associated with the source. A plurality of metallic gates is connected between the source and each drain, and a plurality of metallic gates couples the two drains to each other. Each drain is connected to its source of reverse bias potential by way of an impedance preferably in the form of an elongated strip of diffused semiconductor material of the same conductivity type as the drain. This embodiment provides logical functions with inversion.

In another embodiment, one drain and two sources are provided to achieve source follower logical functions.

The foregoing and other objects, features and advantages of the invention will be apparent from the following more particular description of preferred embodiments of the invention, as illustrated in the accompanying drawings.

Figure 1:
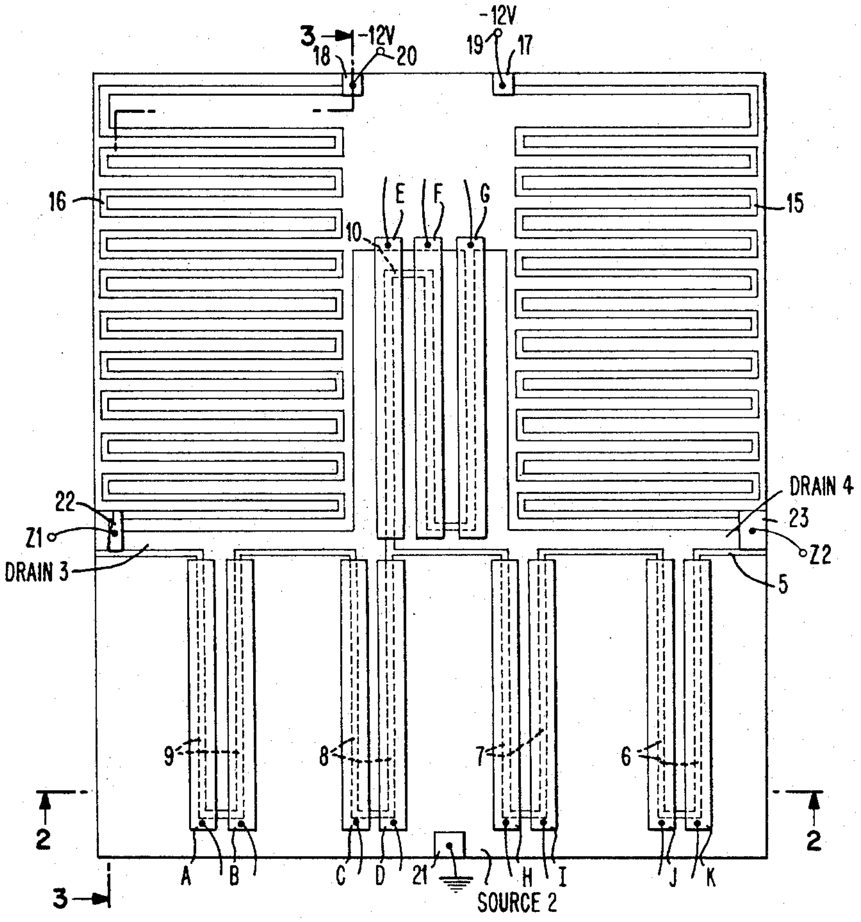
FIG. 1 is a plan view of one form of the improved logical element.
Figure 2:
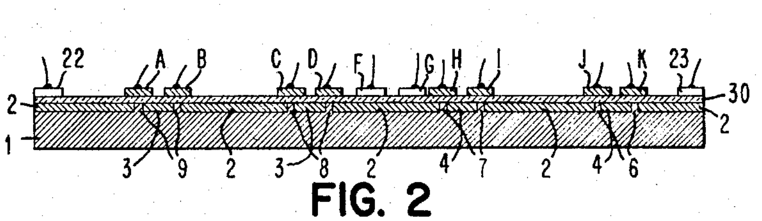
FIG. 2 is a vertical section along line 2—2 of FIG. 1.
Figure 3:
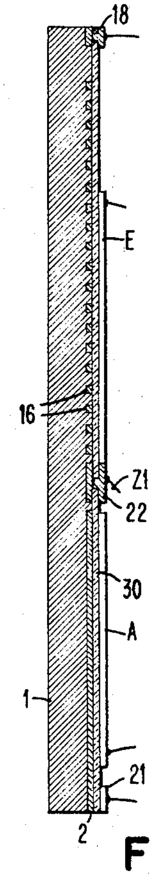
FIG. 3 is a vertical section along line 3—3 of FIG. 1.

The improved logical element of FIGS. 1–3 includes a substrate 1 which, in the preferred embodiment, is a substrate of silicon semiconductor material of the N conductivity type. By means of the usual diffusion process, a source 2 and a pair of drains 3 and 4, all of a P conductivity type, are formed on the substrate 1. The source 2 is electrically isolated from the drains 3 and 4 by a very narrow channel 5 of the N conductivity type substrate material which extends from the right-hand edge of FIG. 1 to the left-hand edge and includes U-shaped sections 6, 7, 8 and 9. An upwardly extending, generally N-shaped extension 10 of the channel 5 electrically isolates the drains 3 and 4 from each other. Load resistors 15 and 16 are provided in the form of elongated, narrow strips of diffused P material extending from their respective drains to contacts 17 and 18. The contacts are connected to reverse biasing supply terminals 19 and 20.

The source 2 is electrically connected to a metallic contact 21 which is in turn connected to ground potential. Output terminals Z1 and Z2 in the form of metallic contacts 22 and 23 are electrically connected to their respective drains and load impedances 3, 16 and 4, 15.

Usually, the substrate region 1 is connected to ground potential.

With particular reference to FIGS. 2 and 3, it will be seen that the substrate 1, the source and the drains are overlaid with a film of insulating material 30 such as silicon dioxide. A pair of elongated metallic gates A and B is deposited on top of the insulating film 30 immediately above the U-shaped channel section 9 for controlling the electrical coupling of the source 2 to the drain 3 when bias potentials of proper polarity are applied thereto.

Similarly, metallic gates C and D are provided for electrically coupling the source 2 to the drain 3 and gates H, I, J and K are provided for controlling the electrical coupling of the source 2 to the drain 4.

With particular reference to FIG. 1, it will be seen that metallic gates E, F and G are provided for controlling the electrical coupling of the drain 3 to the drain 4 when bias potentials of suitable level and polarity are applied thereto.

Figure 4:
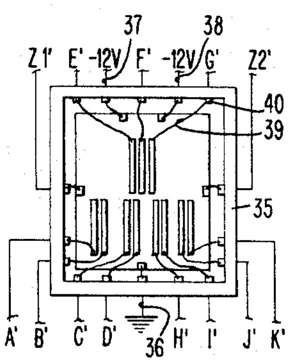
FIG. 4 is a plan view of the improved semiconductor element of FIG. 1 packaged in the form which is commonly referred to in the industry as a "flat-pac"

In FIG. 4 the improved semiconductor element of FIGS. 1–3 is shown mounted in a flat-pac supporting structure 35 having a plurality of input leads A′–K′ inclusive, output leads Z1′ and Z2′, and power supply leads 36, 37 and 38. Wires 39 and terminals 40 connect the gates and contacts of the element of FIG. 1 to corresponding leads of the flat-pac supporting structure 35.

The operation of the improved logical element of FIG. 1 will now be set forth in detail. It will be assumed that the contacts 17, 18 and 21 are connected to their respective supply potentials and that the gates A–K inclusive, have ground potential applied thereto. When ground potential is applied to a metallic gate such as A, the N-type material in the channel 9 provides a very high electrical impedance between the adjacent P-type areas of the source 2 and the drain 3. With the source 2 electrically isolated from the drains 3 and 4, the negative potential at the terminals 19 and 20 will be applied to the output terminals Z1 and Z2 by way of the load impedances 15 and 16 and the contacts 22 and 23.

If a negative potential, for example, negative twelve volts, is applied to the gate A, it will induce in the upper surface (FIG. 2) of the channel section 9 immediately thereunder, a P-type region which provides very low impedance electrical connection between the source 2 and the drain 3, whereby ground potential is applied from the source 2 to the drain 3 and therefore to the output terminal Z1.

Suitable dimensions for the various sections of the improved semiconductor logical element of FIGS. 1–3 will be set forth below; however, it will be appreciated that they are given merely by way of example and may be suitably modified by those skilled in the art without departing from the true spirit and scope of the invention.

The cross-sectional widths of the elongated load resistors 15 and 16 can be in the order of 1/1000 inch. The width to length ratio of the portions of the channels 6–10 inclusive, which underlie a respective gate A–K, should be in the order of 80:1. The minimum diffusion separation should be in the order of 5/10000 inch. A suitable substrate resistivity may be in the order of ten ohm-centimeters. The sheet resistivity can be in the order of two and five-tenths ohms per square for an N on P-type diffusion or, alternatively, five and five-tenths ohms per square for a P on N-type diffusion. The insulating film 30 can have a thickness in the order of two thousand–four thousand angstroms. The load resistors 15 and 16 can have resistance values in the order of four thousand ohms each. A suitable diffusion depth can be in the order of three microns. The P-type diffusion width can be in the order of 3/1000 inch.

It will be appreciated that the conductivity types of the substrate material and the diffusion areas can be reversed. The polarity of the bias supply and the control signals would also be reversed.

Figure 5:
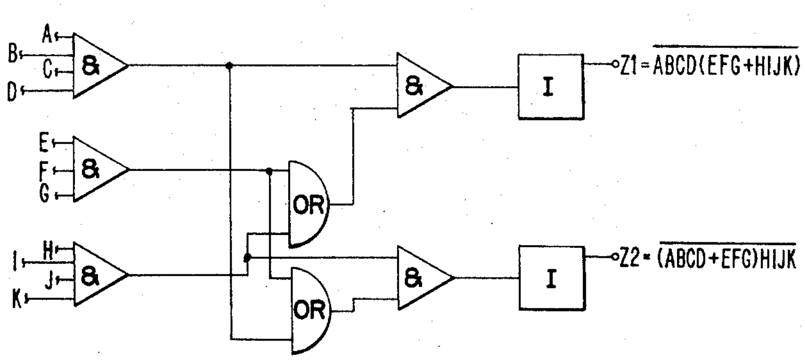
FIGS. 5–9 are diagrammatic views of a few of the logical configurations which the improved element of FIGS. 1–3 can take.

The typical logical decisions which can be made with the improved semiconductor element of FIGS. 1–3 are shown in FIGS. 5–9 inclusive. FIG. 5 shows the general logic decision made by the element, it being assumed that a logical "1" condition is characterized by ground potential and a logical "0" conidtion by a negative twelve volt potential.

With logical "1" ground potentials applied to the input gates A, B, C and D, no current will flow directly from the source 2 to the drain 3.

Similarly, when logical "1" ground potentials are applied to the gates E, F and G, no electrical connection is made between the drains 3 and 4.

When logical "1" ground potentials are applied to the gates H, I, J and K, no electrical connection is made between the source 2 and the drain 4.

Accordingly, the output terminals Z1 and Z2 have a logical "0" (negative twelve volt potential) applied thereto when the gates A–K inclusive are at ground potential. If, for example, a negative twelve volt potential (logical "0") is applied to any one gate A–D, ground potential will be applied directly from the source 2 to the output terminal Z1, but not to the output terminal Z2. If a logical "0" (negative twelve volt potential) is applied to any gate E, F or G and to one of the leads H, I, J or K, ground potential will be extended to the output terminal Z1 by way of the source 2, the drain 4, the drain 3 and of course, appropriate sections of the channel 5.

The application of a logical "0" (negative twelve volt potential) signal to any one of the input contacts H–J will apply ground potential to the output terminal Z2. Similarly, the application of a logical "0" signal to any one of the contacts A–D and any one of the contacts E–G will apply ground potential to the output terminal Z2.

Thus the basic principle of operation of the element of FIG. 1 is characterized by a three-level logical decision followed by stages of inversion as shown in FIG. 5.

Other possible logical functions shown in FIGS. 6–9, are achieved by effecting certain external connections in the logical elemnet of FIG. 1.

Figure 6:
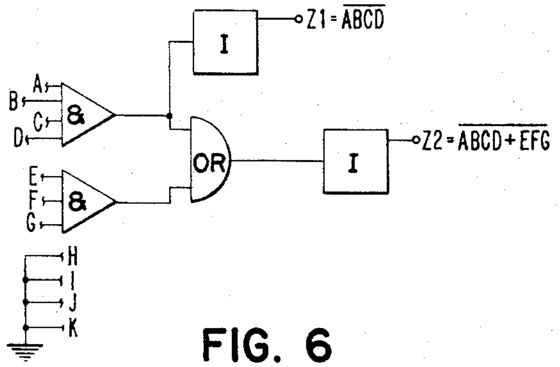

More particularly, the contacts H, I, J and K in FIG. 6 are connected to ground potential to prevent current flow directly from the source 2 to the drain 4. This results in the output Z1 performing an AND invert function with respect to the inputs A–D. The Z2 output provides an AND/OR invert logical function with respect to the inputs A–D and E–G.

Figure 7:
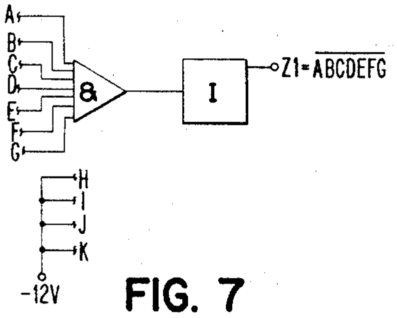

In the logical configuration illustrated in FIG. 7, any one or more of the contacts H, I, J and K is wired to a negative twelve volt potential, thereby extending ground potential from the source 2 to the drain 4, whereby a seven-way AND invert circuit is provided with respect to the contacts A–G, inclusive, and output Z1.

Figure 8:
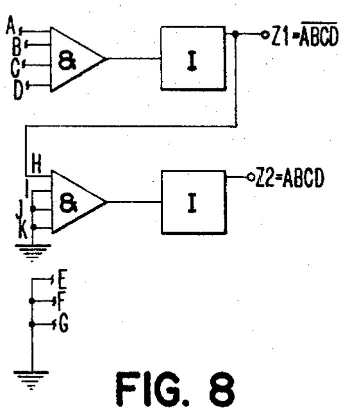

To achieve the locical configuration illustrated in FIG. 8, the contacts E, F, G and I, J, K are connected to ground potential and the output terminal Z1 is connected to the input terminal H. Z1 now provides an AND invert function with respect to the input leads A, B, C and D, and output terminal Z2 provides an AND non-invert function with respect to the input terminals A, B, C and D, whereby complementary output signals are achieved.

Figure 9:
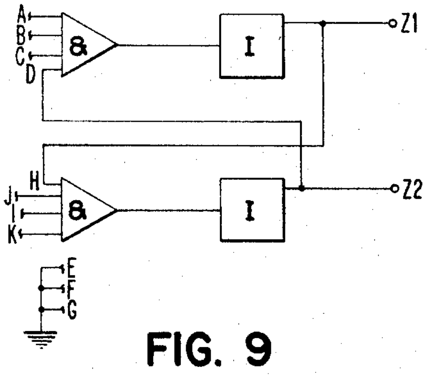

The bistable latch arrangement illustrated in FIG. 9 is realized by connecting the contacts E, F and G to ground potential, by connecting the output terminal Z1 to the input terminal H and by connecting the output terminal Z2 to the input terminal D. A three-way input set and reset bistable latch is provided, and the latch includes complementary outputs Z1 and Z2. It will be appreciated that one group of inputs will be the set and the other the reset input source. If only one set and one reset input is desired, contacts B, C, I and J can be connected to ground potential with the single set and reset inputs being conected to the contacts A and K.

It will be appreciated that other logical configurations can be achieved by arbitrarily connecting various inputs to ground or negative twelve volt potentials and by suitable interconnections between the input and output terminals, and that those configurations illustrated in FIGS. 5–9 are given by way of example.

What is believed to be of significant importance is the effective use of the semiconductor elements in each of the logical configurations which the circuit can take and the consequent economy of the logical element. More particularly, it can be seen that the source, both drains, and the load resistors 15 and 16 are utilized in each illustrated logical configuration.

It will be appreciated that additional drains similar to drains 3 and 4 may be provided where desired to achieve much more complex and varied logical decisions. The same source will be used for each of the drains; and each drain will have its respective resistor similar to resistor 15, its respective set of input contacts such as A–D, and drain cross-coupling contacts such as E–G. It will also be appreciated that the number of contacts in each group such as A–D, H–J and E–G may be suitably increased or decreased.

Also, arbitrary selection of ground and minus twelve volt signal levels as logical "0" and "1" conditions change the logical functions performed by the various circuit configurations.

Figure 10:
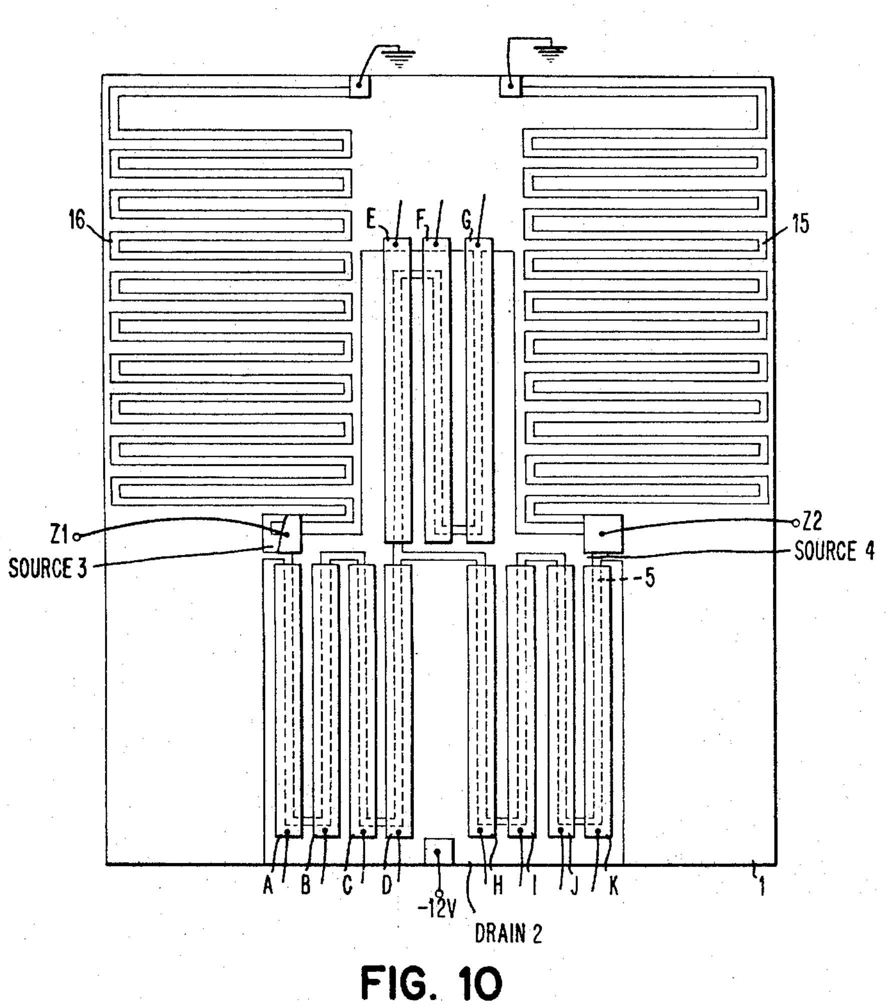
FIG. 10 is a plan view of another form which the improved logical element can take.

FIG. 10 illustrates a second embodiment in which either one source and two drains or one drain and two sources may be provided. Since the use of one source and two drains has been fully discussed with respect to the embodiment of FIG. 1, it will not be repeated in detail with respect to the embodiment of FIG. 10. It is sufficient that one appreciates that the corresponding semiconductor regions of FIGS. 1 and 10 can be controlled to operate in an identical fashion.

The only essential change is the reduction in FIG. 10 of the area of the region corresponding to the source 2 in FIG. 1. This is of little significance when the element of FIG. 10 is operated in the manner described above with respect to FIG. 1. However, as we will see below, this change is necessary when this region is connected to a negative twelve volt supply to provide a source follower mode of operation. The substrate, as indicated above is usually connected to ground potential; and the substrate and this region form a capacitive element in the form of a reverse biased diode junction. This capacity must be minimized by reducing the junction area.

The embodiment of FIG. 10 will now be described with respect to its operation as a source follower device. Corresponding physical portions of the elements in FIGS. 1 and 10 are assigned similar reference numerals and letters.

Thus, the element of FIG. 10 includes a substrate 1 of semiconductor material of the N conductivity type. A drain 2, sources 3 and 4, and resistors 15 and 16 of P conductivity type are diffused in the substrate. The drain is connected to a negative supply terminal and the resistors 15 and 16 are connected to ground potential.

Gates A–D, H–K and E–G control the electrical conductivity between the drain 2 and the source 3, the drain 2 and the source 4, and sources 3 and 4, respectively. When ground potential is applied to each gate, no electrical connection is made between the P regions which it overlies. When a suitable negative potential is applied to a gate, it electrically connects the P regions which it overlies.

Normally, the output terminals Z1 and Z2 have ground potential applied by way of the resistors 16 and 15, respectively. When one of the gates A–D has a negative potential applied thereto, it applies the negative twelve volt supply to the terminal Z1 by way of the drain 2 and the source 3. A negative potential at one of the gates H–K applies the negative twelve volt supply to the output terminal Z2 by way of the drain 2 and the source 4. A negative potential at one of the gates E–G electrically connects the source 3 to the source 4.

Consequently, it will be seen that the embodiment of FIG. 10 operated in the form of a source follower will have a basic principle of operation similar to the logical configuration of FIG. 5 except that there are no invert functions. Similarly, this embodiment can be arranged to perform logical functions similar to those shown in FIGS. 6 and 7 with the invert functions deleted. Since inverted signals cannot be obtained, this embodiment cannot perform functions similar to those shown in FIGS. 8 and 9.

Figure 11:
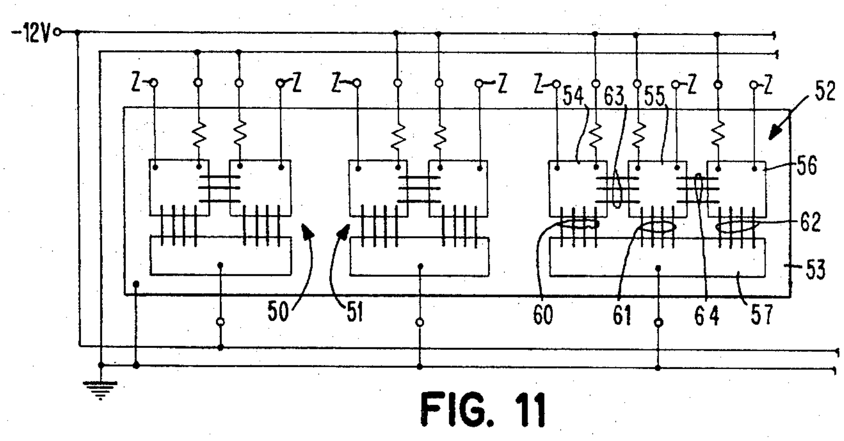
FIG. 11 diagrammatically illustrates a plurality of the improved logical elements fabricated on a single substrate.

FIG. 11 illustrates diagrammatically the formation of three of the improved logical elements 50, 51 and 52 on a single substrate 53. The element 50 is shown as being in the form of a source follower; and elements 51 and 52, in the form of invert blocks.

In addition, the element 52 is shown with three drain portions 54, 55 and 56. Each of these drains is coupled to the source 57 by respective sets of gates 60, 61 and 62. The drains 54 and 55 are coupled by gates 63. The drains 55 and 56 are coupled by gates 64.

In commercial practice, the formation of a plurality of logical elements on a single substrate with a physical configuration of the type shown in FIG. 10 permits the use of each element either as an invert or non-invert functional block. The selection is made merely by the external connection of the two power supply terminals to each element. This forms the basis for an extremely versatile, truly universal logical element.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor element of the insulated gate, field effect type comprising a semiconductor substrate of one conductivity type;

a first semiconductor region of the opposite conductivity type formed on one surface of the substrate;

second and third semiconductor regions of said opposite conductivity type formed on said substrate surface, each positioned closely adjacent a respective portion of the first region and closely adjacent each other;

the substrate including a narrow elongated channel portion at said surface interposed between and electrically isolating the three regions from each other;

load impedances coupled to said second and third regions;

first and second output terminals electrically connected to the second and third regions respectively;

an operating potential having a pair of terminals, one of which is connected to the first region and the other of which is connected to the load impedances;

a film of insulating material overlaying the substrate and said regions; and a plurality of elongated metallic gate means on the insulating film and electrically isolated from the semiconductor substrate and regions, first, second and third ones of said gate means being positioned over respective sections of the channel which separate the first and second regions, the first and third regions and the second and third regions respectively, each gate means responsive to input signals of a selected polarity and level for inducing on the juxtaposed surface of the channel a portion of said opposite conductivity type for electrically connecting its respective regions to each other.

2. The semiconductor element set forth in claim 1 wherein the operating potential terminals apply a reference potential to the first semiconductor region and a reverse bias potential to the second and third semiconductor regions, thereby operating the semiconductor element in an invert mode.

3. The semiconductor element set forth in claim 1 wherein the operating potential terminals apply a reference potential to the second and third semiconductor regions and a reverse bias potential to the first semiconductor regions to operate the semiconductor element in a non-invert mode.

4. The semiconductor element set forth in claim 1 wherein said plurality of gate means includes first, second and third groups of gates positioned over respective channel sections separating the first and second, first and third, and second and third semiconductor regions respectively.

5. The semiconductor element set forth in claim 4 together with means connected to selected ones of said gates and output terminals for operating the element as a selected one of a plurality of available logical configurations.

6. A semiconductor element of the insulated gate, field effect type comprising a semiconductor substrate of one conductivity type;

a first semiconductor region of the opposite conductivity type formed on one surface of the substrate and adapted for connection with one terminal of an operating potential;

second and third semiconductor regions of said opposite conductivity type formed on said substrate surface, each positioned closely adjacent a respective portion of the first region and closely adjacent each other;

the substrate including a narrow elongated channel portion at said surface interposed between and electrically isolating the three regions from each other;

load impedances coupled to said second and third regions and adapted for connection with another terminal of the operating potential;

first and second output terminals electrically connected to the second and third regions respectively;

a film of insulating material overlaying the substrate and said regions; and a plurality of elongated metallic gate means on the insulating film and electrically isolated from the semiconductor substrate and regions, first, second and third ones of said gate means being positioned over respective sections of the channel which separate the first and second regions, the first and third regions and the second and third regions respectively, and adapted to receive input signals of a selected polarity and level for inducing on the juxtaposed surface of the channel a portion of said opposite conductivity type for electrically connecting its respective regions to each other.

7. An integrated semiconductor structure of the insulated gate, field effect type comprising a semiconductor substrate of one conductivity type; and a plurality of multifunction logical elements, at least certain of said elements each including a first semiconductor region of the opposite conductivity type formed on one surface of the substrate and adapted for connection with one terminal of an operating potential;

second and third semiconductor regions of said opposite conductivity type formed on said substrate surface, each positioned closely adjacent a respective portion of the first region and closely adjacent each other;

a narrow elongated channel portion of said surface of the substrate interposed between and electrically isolating the three regions from each other;

load impedances coupled to said second and third regions and adapted for connection with another terminal of the operating potential;

first and second output terminals electrically connected to the second and third regions respectively;

a film of insulating material overlaying the substrate and said regions; and a plurality of elongated metallic gate means on the insulating film and electrically isolated from the semiconductor substrate and regions, first second and third ones of said gate means being positioned over respective sections of the channel which separate the first and second regions, the first and third regions and the second and third regions respectively, and adapted to receive input signals of a selected polarity and level for inducing on the juxtaposed surface of the channel a portion of said opposite conductivity type for electrically connecting its respective regions to each other.

8. The integrated structure set forth in claim 7 wherein each plurality of gates associated with a respective multifunction logical element includes first, second and third groups of gates positioned over respective channel sections separating the associated first and second, first and third, and second and third semiconductor regions respectively.

9. The integrated structure set forth in claim 8 together with means connected to selected ones of said gates and output terminals for operating each multifunction logical element as a selected one of a plurality of available logical configurations.

10. A semiconductor element of the insulated gate, field effect type comprising a semiconductor substrate of one conductivity type;

a source of the opposite conductivity type diffused in one surface of the substrate and having an irregular elongated periphery;

first and second drains of said opposite conductivity type diffused in said surface of the substrate, each having an irregular elongated periphery positioned closely adjacent a respective portion of the source periphery and each having an irregular elongated portion positioned closely adjacent a respective portion of the other drain periphery;

the substrate material including a narrow elongated channel portion interposed between and electrically isolating the source from each drain and electrically isolating the drains from each other;

first and second elongated strips of semiconductor material of said opposite conductivity type diffused upon the substrate, electrically connected to the first and second drains respectively, and forming load impedances for their respective drains;

first and second output terminals electrically connected to the first and second drains respectively;

a power supply having a pair of terminals, one of which is connected to the source and the other of which is connected to ends of the load impedances remote from the ends which are connected to the drains;

a film of insulating material overlaying the substrate, the source, the drains and the load resistors, and a means including a plurality of elongated metallic gates deposited on the insulating film and electrically isolated from the substrate, the source and drains, at least first and second gates being positioned over respective sections of the channel which separate the source from each of the drains and at least a third gate being positioned over the channel section separating one of the drains from the other, said gates adapted to receive input signals of a selected polarity and level for inducing in the juxtaposed section of the channel an area of said opposite conductivity type for electrically connecting its respective source and drain or pair of drains.

11. The semiconductor element set forth in claim 10 wherein said plurality of gates includes first and second groups of gates positioned over respective channel sections separating the source from the first and second drains respectively, and a third group of gates positioned over respective channel sections separating the drains from each other.

12. The semiconductor element set forth in claim 11 together with
means connected to selected ones of said gates and output terminals for operating the element as a selected one of a plurality of available logical configurations.

13. The semiconductor element set forth in claim 11 together with
means connecting the third group of gates to said one terminal of the power supply, and
means cross coupling the first and second output terminals respectively to a gate in the second and first groups for operating the element as a bistable latch.

14. A semiconductor element of the insulated gate, field effect type comprising:
a semiconductor substrate of one conductivity type;
a drain of the opposite conductivity type diffused in one surface of the substrate and having an irregular elongated periphery;
first and second sources of said opposite conductivity type diffused in said surface of the substrate, each having an irregular elongated periphery positioned closely adjacent a respective portion of the drain periphery and each having an irregular elongated portion positioned closely adjacent a respective portion of the other source periphery;
the substrate material including a narrow elongated channel portion interposed between and electrically isolating the drain from each source and electrically isolating the sources from each other;
first and second elongated strips of semiconductor material of said opposite conductivity type diffused upon the substrate, electrically connected to the first and second sources respectively, and forming load impedances for their respective sources;
first and second output terminals electrically connected to the first and second sources respectively;
a power supply having a pair of terminals, one of which is connected to the drain and the other of which is connected to ends of the load impedances remote from the ends which are connected to the sources;

a film of insulating material overlaying the substrate, the sources, the drain and the load resistors, and
a means including a plurality of elongated metallic gates deposited on the insulating film and electrically isolated from the substrate, the sources and drain, at least first and second gates being positioned over respective sections of the channel which separate the drain from each of the sources and at least a third gate being positioned over the channel section separating one of the sources from the other, said gates adapted to receive input potentials of a selected polarity and level for inducing in the juxtaposed section of the channel an area of said opposite conductivity type for electrically connecting its respective source and drain or pair of sources.

15. The semiconductor element set forth in claim 14 wherein said plurality of gates includes
first and second groups of gates positioned over respective channel sections separating the drain from the first and second sources respectively, and
a third group of gates positioned over respective channel sections separating the sources from each other.

16. The semiconductor element set forth in claim 15 together with
means connected to selected ones of said gates and output terminals for operating the element as a selected one of a plurality of available logical configurations.

References Cited

UNITED STATES PATENTS

| | | | |
|---|---|---|---|
| 3,191,061 | 6/1965 | Weimer | 307—88.5 |
| 3,233,123 | 2/1966 | Heiman | 307—88.5 |
| 3,258,663 | 6/1966 | Weimer | 317—235 |
| 3,275,996 | 9/1966 | Burns | 340—173 |
| 3,284,782 | 11/1966 | Burns | 340—173 |
| 3,289,093 | 11/1966 | Wanlass | 330—35 |
| 3,296,547 | 1/1967 | Sickles | 330—35 |

JOHN W. HUCKERT, *Primary Examiner.*

R. F. SANDLER, *Assistant Examiner.*